United States Patent [19]

Sridevan et al.

[11] Patent Number: 5,742,076

[45] Date of Patent: Apr. 21, 1998

[54] SILICON CARBIDE SWITCHING DEVICES HAVING NEAR IDEAL BREAKDOWN VOLTAGE CAPABILITY AND ULTRALOW ON-STATE RESISTANCE

[75] Inventors: Srikant Sridevan, Raleigh, N.C.; Peter Kerr McLarty, Plano, Tex.; Bantval Jayant Baliga, Raleigh, N.C.

[73] Assignee: North Carolina State University, Raleigh, N.C.

[21] Appl. No.: 658,733

[22] Filed: Jun. 5, 1996

[51] Int. Cl.⁶ .................... H01L 29/161; H01L 29/12; H01L 29/51; H01L 29/78
[52] U.S. Cl. .................... 257/77; 257/78; 257/289; 257/295; 257/331; 257/341; 257/410
[58] Field of Search .................... 257/77, 78, 295, 257/289, 331, 341, 410

[56] References Cited

U.S. PATENT DOCUMENTS

| | | | |
|---|---|---|---|
| 2,791,760 | 5/1957 | Ross | 257/295 |
| 3,412,297 | 11/1968 | Amlinger | 317/235 |
| 4,288,801 | 9/1981 | Ronen | 357/41 |
| 4,893,160 | 1/1990 | Blanchard | 357/23.4 |
| 4,914,058 | 4/1990 | Blanchard | 437/203 |
| 5,072,266 | 12/1991 | Bulucea et al. | 357/23.4 |
| 5,215,599 | 6/1993 | Hingorani et al. | 136/255 |
| 5,298,781 | 3/1994 | Cogan et al. | 257/333 |
| 5,307,305 | 4/1994 | Takasu | 257/77 |
| 5,323,040 | 6/1994 | Baliga | 257/332 |
| 5,323,044 | 6/1994 | Rumennik et al. | 257/379 |
| 5,430,315 | 7/1995 | Rumennik | 257/331 |
| 5,473,176 | 12/1995 | Kakumoto | 257/192 |
| 5,558,313 | 9/1996 | Hshieh et al. | 257/342 |

OTHER PUBLICATIONS

Kurogi et al JJ AP vol. 44 1975 pp. 197–202 Ferroelectric . . . Fr/m.

B. Jayant Baliga, *Power MOSFET*, Chapter 7, Power Semiconductor Devices, 1996, pp. 335–425.

M. Bhatnagar, et al., *SiC Power UMOSFET: Design, Analysis and Technological Feasibility*, Inst. Phys. Conf. Ser. No. 137: Chapter 7, 1994, pp. 703–706.

B. Jayant Baliga, *New Materials Beyond Silicon For Power Devices*, Power Semiconductor Devices and Circuits, 1992, pp. 377–389.

Bhatnagar, et al., *Comparison of 6H–SiC, 3C–SiC, and Si For Power Devices*, IEEE Transactions On Electron Devices, vol. 40, No. 3, Mar. 1993, pp. 645–655.

(List continued on next page.)

*Primary Examiner*—Jerome Jackson
*Attorney, Agent, or Firm*—Myers, Bigel, Sibley & Sajovec

[57] ABSTRACT

A silicon carbide switching device having near ideal electrical characteristics includes an electrical insulator with an electrical permittivity greater than about ten times the permittivity of free space ($\epsilon_o$) and more preferably greater than about fifteen times the permittivity of free space, as a gate electrode insulating region. The use of electrical insulators having high electrical permittivities relative to conventional electrical insulators such as silicon dioxide significantly improves the breakdown voltage and on-state resistance characteristics of a silicon carbide switching device to the point of near ideal characteristics, as predicted by theoretical analysis. Thus, the preferred advantages of using silicon carbide, instead of silicon, can be more fully realized. Electrical insulators having low critical electric field strengths relative to conventional electrical insulators such as silicon dioxide can also be used even though these insulators are relatively more susceptible to field induced dielectric breakdown for a given electric field strength. Such electrical insulators include titanium dioxide.

34 Claims, 7 Drawing Sheets

OTHER PUBLICATIONS

M. Bhatnagar, et al., *Comparison Of Ti and Pt Silicon Carbide Schottky Rectifiers*, IEDM 92, pp. 789–792.

M. Bhatnagar, et al., *Silicon–Carbide High–Voltage (400 V) Schottky Barrier Diodes*, IEEE Electron Device Letters, vol. 13, No. 10, Oct. 1992, pp. 501–503.

Alok, et al., *Low Contact Resistivity Ohmic Contacts to 6H–Silicon Carbide*, IEDM 93, pp. 691–694.

Alok, et al., *Electrical Properties of Thermal Oxide Grown on n–type 6H–Silicon Carbide*, Appl. Phys. Lett., vol. 64, No. 21, May 23, 1994, pp. 2845–2846.

Alok, et al., *Electrical Properties of Thermal Oxide Grown Using Dry Oxidation on p–type 6H–Silicon Carbide*, Appl. Phys. Lett., vol. 65, No. 17, Oct. 24, 1994, pp. 2177–2178.

Alok, et al., *A Simple Edge Termination for Silicon Carbide Devicces with Nearly Ideal Breakdown Voltage*, IEEE Electron Device Letters, vol. 15, No. 10, Oct. 1994, pp. 394–395.

Alok, et al., *A Novel Method For Etching Trenches In Silicon Carbide*, Journal of Electronic Materials, vol. 24, No. 4, 1995, pp. 311–314.

A. Moki, et al., *Low Resistivity As–Deposited Ohmic Contacts to 3C–SiC*, Journal of Electronic Materials, vol. 24, No. 4, 1995, pp. 315–318.

Shenoy, et al., *Planar, Ion Implanted, High Voltage 6H–SiC P–N Junction Diodes*, IEEE Electron Device Letters, vol. 16, No. 10, Oct. 1995, pp. 454–456.

Alok, et al. *Thermal Oxidation of 6H–Silicon Carbide at Enhanced Growth Rates*, IEEE Electron Device Letters, vol. 15, No. 10, Oct. 1994, pp. 424–426.

Palmour, et al., *Vertical Power Devices In Silicon Carbide*, Inst. Phys. Conf. Ser. No. 137, Chapter 6, 1994 IOP Publishing Ltd., pp. 499–503.

Fuyuki, et al., *Effects of Small Amount of Water on Physical and Electrical Properties of $TiO_2$ Films Deposited by CVD Method*, The Journal of the Electrical Chemical Society, vol. 135, No. 1, 1988, pp. 248–250.

Stecki, et al., *Residue–Free Reactive Ion Etching of $\beta$–SiC in $CHF_3/O_2$ with $H_2$ Additive*, Appl. Phys. Lett., vol. 60, No. 16, Apr. 20, 1992, pp. 1966–1968.

Masao Taguchi, *Comparison of DRAM Capacitor Dielectric by Stored Charge and Holding Time Using TQV Chart*, IEEE Electron Device Letters, vol. 13, No. 13, Dec. 1992, pp. 642–644.

Fuyuki et al., *Electronic Properties of the Interface Between Si and $TiO_2$ Deposited at Very Low Temperatures*, Japanese Journal of Applied Physics, vol. 25, No. 9, Sep., 1986, pp. 1288–1291.

G.P. Burns, *Titanium Dioxide Dielectric Films Formed By Rapid Thermal Oxidation*, J. Appl. Phys., vol. 65, No. 5, Mar. 1, 1989, pp. 2095–2097.

Tye, et al., *Electrical Characterisitics of Epitaxial $CeO_2$ on Si(111)*, Appl. Phys. Lett., vol. 65, No. 24, Dec. 12, 1994, pp. 3081–3083.

Katsuta, et al., *Electrical Properties of Rutile ($TiO_2$) Thin Film*, Japanese Journal of Applied Physics, vol. 10, No. 8, Aug. 1971, pp. 976–986.

Krupanidhi, et al, *Pulsed Laser Deposition of Strontium Titanate Thin Films For Dynamic Random Access Memory Applications*, Thin Solid Films, vol. 249, 1994, pp. 100–108.

Constapel, et al., *Trench–IGBTs With Integrated Diverter Structures*, Proceedings of the 7th International Symposium on Power Semiconductor Devices & ICs, ISPSD '95, May 23–25, 1995, pp. 201–206.

Palmour, et al., *High Temperature 4H–Silicon Carbide Thyristors and Power MOSFETS*, Space Technology and Applications International Forum, Part Three, AIP Conference Proceedings 361, 1996 American Institute of Physics, pp. 1321–1326.

Allen, et al., *Silicon Carbide MESFET's With 2 W/mm and 50 P.A.E. At 1.8 GHz*, Proceedings of the 1996 MTT Conference.

SILICON CARBIDE SWITCHING DEVICES HAVING NEAR IDEAL BREAKDOWN VOLTAGE CAPABILITY AND ULTRALOW ON-STATE RESISTANCE

FIELD OF THE INVENTION

The present invention relates to semiconductor switching devices, and more particularly to switching devices for high power applications.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween.

The power MOSFET's gate electrode is separated from the channel region by an intervening electrically insulating region comprising silicon dioxide (e.g., SiO$_2$). Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated gate electrode, minimal current demands are placed on the gate and the gate drive circuitry can be easily implemented. Moreover, because current conduction in the MOSFET occurs through majority carrier transport only, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop of power MOSFETs increases with increasing temperature, thereby promoting an even current distribution in parallel connected devices. Other MOS-gated power devices such as IGBTs can also take advantage of the benefits achieved by using insulated gate electrodes for controlling turn-on and turn-off.

In view of these desirable characteristics, many variations of power MOSFETs have been designed using silicon dioxide as a gate insulating material. Two popular types are the double-diffused MOSFET device (DMOSFET) and the UMOSFET device. These and other power MOSFETs are described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into the N+ drain region are also disclosed in an article by T. Syau, P. Venkatraman and B. J. Baliga, entitled *Comparison of Ultralow Specific On-Resistance UMOSFET Structures: The ACCUFET, EXTFET, INVFET, and Conventional UMOSFETs*, IEEE Transactions on Electron Devices, Vol. 41, No. 5, May (1994). As described by Syau et al., specific on-resistances in the range of 100–250 µΩcm$^2$ were experimentally demonstrated for devices capable of supporting a maximum of 25 volts. However, the performance of these devices was limited because the forward voltage was supported across the gate oxide at the bottom of the trench, which is more readily susceptible to parasitic field-induced breakdown, instead of the semiconductor substrate.

Figure 1:
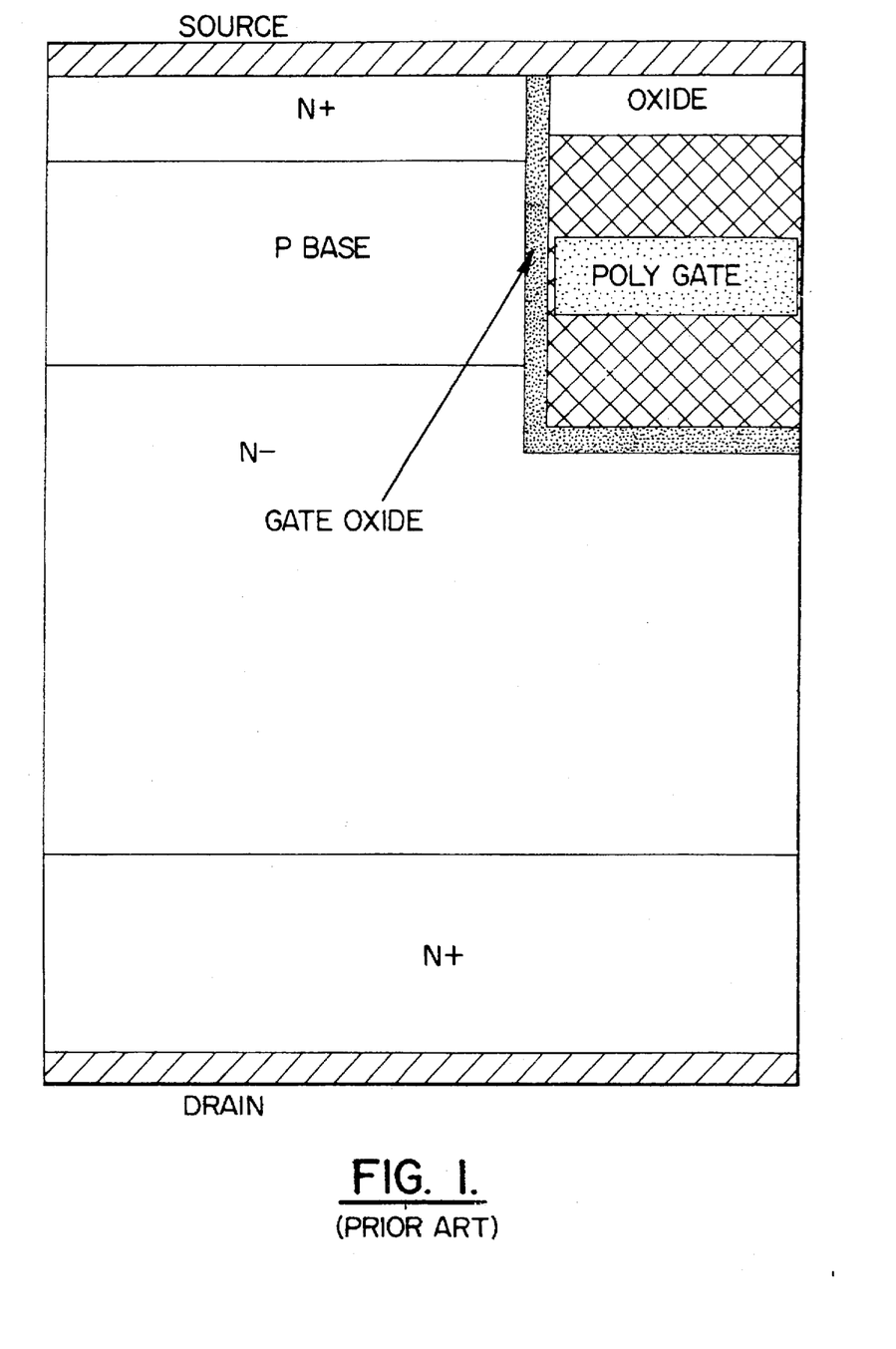
FIG. 1 illustrates a cross section of a prior art silicon UMOSFET.

FIG. 1, which is a reproduction of FIG. 1(d) from the aforementioned Syau et al. article, discloses a conventional silicon UMOSFET structure having adjacent stripe-shaped trenches. In the blocking mode of operation, this UMOSFET supports most of the forward voltage across the N– drift layer which can be doped at relatively low levels to obtain a high maximum blocking voltage capability, however low doping levels in the drift region typically increase the on-state series resistance. Based on the competing design requirements of high blocking voltage and low on-state resistance, a fundamental figure of merit for power devices has been derived which relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp}=5.93\times10^{-9}(BV)^{2.5}$$

Thus, for a device with 60 volt blocking capability, the ideal specific on-resistance is 170 µΩcm$^2$. However, because of the additional resistance contribution from the channel region (P base), reported specific on-resistances for UMOSFETs are typically much higher. For example, a silicon UMOSFET having a specific on-resistance of 730 µΩcm$^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251, (1989). The above described benefits of using silicon MOSFETs for power applications are also applicable to silicon carbide MOSFETs such as those described in U.S. Pat. Nos. 5,233,215 and 5,323,040 to B. J. Baliga, entitled *Silicon Carbide Power MOSFET with Floating Field Ring and Floating Field Plate and Silicon Carbide Field Effect Device*, respectively. Moreover, theoretical analysis has shown that the drift region resistance of silicon carbide (SiC) power devices can be about 200 times lower than that of silicon power devices with comparable breakdown voltages. This theoretical analysis is described, for example, in an article by M. Bhatnagar et al. entitled *SiC Power UMOSFET: design, analysis and technological feasibility*, Proc. of 5th SiC and Rel. Mat. Conf., Washington, D.C., pp. 703–706 (1993). This resistance advantage is principally due to the high electric field strength of silicon carbide (e.g., $2-4\times10^6$ V/cm) compared to silicon (e.g., $2\times10^5$ V/cm).

Notwithstanding the expected performance advantages of silicon carbide relative to silicon for high power applications, silicon carbide power devices can be susceptible to gate dielectric breakdown, as described in an article by J. W. Palmour et al. entitled *Vertical Power Devices in SiC*, Proc. of 5th SiC and Rel. Mat. Conf., Washington, D.C., pp. 499–502 (1993). This breakdown mechanism limits the theoretically attainable performance advantages of silicon carbide power device over silicon power devices. Accordingly, there still continues to be a need to develop silicon carbide power devices which are less susceptible to gate dielectric breakdown.

SUMMARY OF THE INVENTION

It is therefore an object of the present invention to provide silicon carbide switching devices having near ideal breakdown voltage characteristics, and methods of forming same.

It is another object of the present invention to provide silicon carbide switching devices having ultra-low on-state resistance, and methods of forming same.

It is a further object of the present invention to provide silicon carbide switching devices which are capable of handling high on-state current densities with low gate drive power requirements, and methods of forming same.

These and other objects are provided by silicon carbide switching devices having insulated gate electrodes which comprise an electrical insulator with an electrical permittivity greater than about ten times the permittivity of free space ($\epsilon_o$) and more preferably greater than about fifteen times the permittivity of free space, and methods of forming same. According to one aspect of the present invention, the use of electrical insulators having high electrical permittivities relative to conventional electrical insulators for semiconductor devices such as silicon dioxide, can significantly improve the breakdown voltage and on-state resistance characteristics of a silicon carbide switching device to the point of near ideal characteristics, as predicted by theoretical analysis. The preferred advantages of using silicon carbide, instead of silicon, can therefore be more fully realized. According to another aspect of the present invention, electrical insulators having low critical electric field strengths relative to conventional electrical insulators such as silicon dioxide, can also be used even though these insulators are relatively more susceptible to field induced dielectric breakdown for a given electric field strength. Thus, the present invention achieves the totally unexpected result whereby insulators with relatively low critical electric field strengths ($E_{crit}$) can be used to improve the breakdown characteristics of silicon carbide devices which are otherwise susceptible to parasitic dielectric breakdown. Such electrical insulators include titanium dioxide ($TiO_2$).

These electrical insulators which have high electrical permittivities are preferably incorporated into the insulated gate electrodes of silicon carbide switching devices such as field effect transistors, insulated gate bipolar transistors, insulated gate controlled thyristors and bidirectional switching devices, for example, to enhance the breakdown voltage characteristics and reduce the on-state resistance of these devices. This applies to both vertical and lateral silicon carbide switching devices embodying trench and planar insulated gate electrodes.

In particular, a silicon carbide switching device according to the present invention preferably includes a silicon carbide substrate containing a silicon carbide base region therein. A silicon carbide drift region and a silicon carbide source region are also preferably included in the substrate. These regions extend adjacent the base region and form respective P-N junctions therewith. Gate electrode means is also preferably provided adjacent the base region, for modulating the conductivity of the base region in response to the application of a gate bias thereto. The modulation of the base region can include the formation of an inversion layer channel or accumulation layer channel. A gate electrode insulating region is also preferably provided between the gate electrode means and the base and drift regions and includes a material selected from the group consisting of electrical insulators having electrical permittivities greater than about ten times the permittivity of free space ($\epsilon_o$) and more preferably greater than about fifteen times the permittivity of free space. The gate electrode insulating region may also comprise a material having a relatively large electrical permittivity but relatively low critical electric field strength ($E_{crit}$), such as titanium dioxide which has a lower critical electric field strength (e.g., $1-2\times10^6$ V/cm) than silicon dioxide (e.g., $1\times10^7$ V/cm).

According to a preferred vertical silicon carbide switching device, a trench can be formed at a face of a silicon carbide substrate and include a bottom extending adjacent the drift region and substantially vertical sidewalls extending from the drift region, adjacent the base and source regions and to the face, so that the sidewalls and bottom of the trench define interfaces between the substrate and the gate electrode insulating region. However, by using a gate electrode insulating region comprised of a material selected from the group consisting of electrical insulators having relatively large electrical permittivities, premature parasitic field-induced breakdown of the insulating region at the corners of the trench sidewalls and bottom can be inhibited by lowering the electric field strength in the insulating region. This lowering of electric field strength also facilitates the use of electrical insulators which have critical electric field strengths below the critical electric field strength of silicon dioxide (e.g., $1\times10^7$ V/cm).

The present invention also includes methods of forming the above described devices including the step of forming a titanium dioxide gate electrode insulating region to have a preferred electrical permittivity greater than about ten times the electrical permittivity of free space and more preferably in the range between about 15–80 times the electrical permittivity of free space. In accordance with these methods, silicon carbide switching devices, such as power insulated gate field effect transistors (IGFETs), can be formed having specific on-resistances ($R_{sp}$) of about 2.9 m$\Omega$cm$^2$ for 6H—SiC and 0.3 m$\Omega$cm$^2$ for 4H—SiC, which is about twenty and two hundred times lower than the specific on-resistance of a corresponding silicon device, respectively.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type, however, each embodiment described and illustrated herein includes its complementary embodiment as well.

Figure 2:
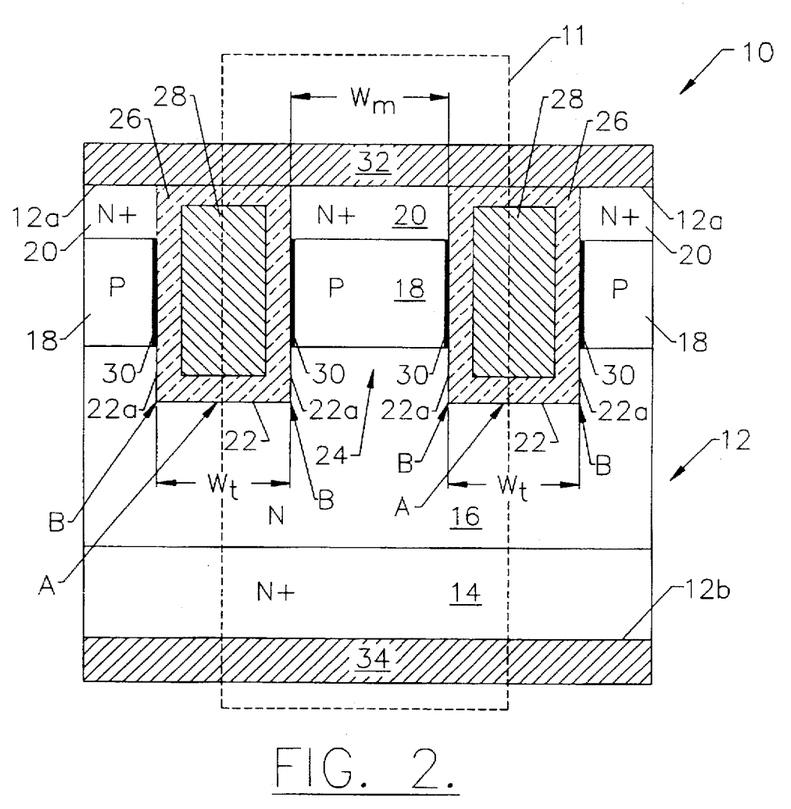
FIG. 2 illustrates a silicon carbide switching device according to one embodiment of the present invention.

Referring now to FIG. 2, a cross-sectional illustration of a silicon carbide switching device according to one embodiment of the present invention is shown. According to this embodiment, the switching device is a power field effect transistor 1) containing a gate electrode insulating region formed of a preselected electrical insulator(s), as more fully described hereinbelow. Alternative embodiments include, for example, insulated gate bipolar transistors, insulated gate controlled thyristors and bidirectional switching devices having a gate electrode insulating region formed of the preselected electrical insulator. The operation of these devices is more fully described in U.S. Pat. Nos. 5,198,687, 5,241,194, 5,306,930, 5,323,040, 5,396,085, 5,396,087, 5,412,228, 5,434,435, 5,471,075, 5,488,236 and 5,493,134 to coinventor Baliga, the disclosures of which are hereby incorporated herein by reference.

For high current applications, the field effect transistor 10 comprises a plurality of adjacent unit cells 11 in a silicon carbide substrate 12 of first conductivity type, typically N-type conductivity. The silicon carbide substrate 12 has a first face 12a and a second opposing face 12b and preferably comprises a relatively highly doped silicon carbide drain region 14 (shown as N+), adjacent the second face 12b. A silicon carbide drift region 16 of first conductivity type (shown as N−) is provided on the drain region 14, opposite the second face 12b. A relatively highly doped silicon carbide source region 20 (shown as N$^+$) extends adjacent the first face 12a. A silicon carbide base region 18 (shown as P) is also provided between the source region 20 and the drift region 16 and forms respective P-N junctions therewith. Alternatively, the silicon carbide base region 18 may be of first conductivity type if the field effect transistor is a silicon carbide ACCUFET as more fully described in U.S. Pat. No. 5,323,040 to Baliga.

A plurality of trenches 22 having width ($W_t$) are also formed in the substrate 12. The trenches 22 may be patterned as stripes extending in a third dimension (not shown) or may be of rectangular, annular or similar pattern, as illustrated by U.S. Pat. No. 5,072,266 to Bulucea et al, for example. Thus, although the trenches 22 are illustrated in transverse cross-section as spaced trenches, pairs of spaced trenches 22 may actually comprise a single trench of annular shape, for example. As illustrated, each trench includes a sidewall 22a, extending between the drift region 16 and the source region 20. Adjacent trenches 22 also define a mesa 24, which includes the base and source regions 18, 20, respectively. Each trench 22 also includes insulating regions 26 along the trench sidewalls 22a and trench bottoms. Conductive gate electrodes 28 are provided in the trenches 22. The conductive gate electrodes 28 typically comprise a metal such as aluminum or polycrystalline silicon which can be appropriately doped to adjust threshold voltage.

The trenches 22 are preferably formed in the substrate 12 using reactive ion etching (RIE) techniques, such as the technique described in an article by A. J. Steckl et al. entitled "*Residue-free reactive ion etching of β-SiC in CHF$_3$/O$_2$ with H$_2$ additive*" Appl. Phys. Lett. Vol. 60, No. 16, pp. 1966–1968 (1992), the disclosure of which is hereby incorporated herein by reference. Alternatively, the trenches 22 can be formed by first amorphizing those portions of the substrate where the trenches are to be formed and then removing the amorphized portions to expose the trenches 22. The steps for amorphizing silicon carbide preferably include the steps of forming a mask on the first face 12a of a monocrystalline silicon carbide substrate 12 and exposing an area on the face 12a corresponding to those portions of the substrate where the trenches are to be formed. Thereafter, ions are directed to the first face 12a such that the ions implant into the substrate through the exposed areas and convert the exposed regions of the substrate into amorphous silicon carbide regions. The amorphous silicon carbide regions can then be removed by etching the substrate 12 using such etchants as HF+HNO$_3$. The above-described steps for forming trenches in monocrystalline silicon carbide are more fully described in U.S. Pat. No. 5,436,174 to B. J. Baliga et al., entitled "*Method for Forming Trenches in Monocrystalline Silicon Carbide*", the disclosure of which is hereby incorporated herein by reference.

As will be understood by those skilled in the art, the application of a positive gate bias relative to the base region 18 causes the formation of N-type inversion layer channels 30 in the base region 18, adjacent the trench sidewalls 22a. These inversion layer channels 30 provide highly conductive paths for majority carriers, between the source region 20 and drift region 16. Source and drain contacts 32 and 34, respectively, are also provided for ohmically contacting the source and drain regions. Electrical contact to the gate electrodes 28 is also made by opening vias in the source contact 32 and insulating regions 26 in a third dimension (not shown). Similarly, electrical contact is made between the source contact 32 and the base region 18 in a third dimension (not shown) to prevent the base region 18 from "floating".

During the forward blocking mode of operation when the drain region 14 is biased positive relative to the source region 20, the electric field strength in the insulating region 26, at location "A" at the center of the bottom of the trench, will be:

$$E_{ox} = \frac{\epsilon_s}{\epsilon_i} \cdot t_i \frac{qN_D}{\epsilon_s \epsilon_o} \left[ \sqrt{1 + \frac{2\epsilon_o \epsilon_i^2}{qN_D \epsilon_i t_i^2} V_{dg}} - 1 \right]$$

where $V_{dg}$ is the applied bias to the drain region 14 relative to the gate electrode 28, $t_i$ is the thickness of the gate electrode insulating region 26 at the bottom of the trench, $N_D$ is the first conductivity type doping concentration in the drift region 16, $\epsilon_i$ is the dielectric constant of the insulating region 26, $\epsilon_s$ is the electrical permittivity of silicon carbide and $\epsilon_o$ is the permittivity of free space ($8.854 \times 10^{-12}$ F/m). It should be noted, however, that the highest electric field strength in the substrate and insulating region 26 does not occur at location A, but occurs at location "B" at the trench corners. This increase is caused by parasitic field crowding. The occurrence of high electric fields at the trench corners can cause premature dielectric breakdown if the electric field strength exceeds the critical electric field strength ($E_{crit}$) of the insulating region 26. The occurrence of dielectric breakdown also precludes the attainment of near ideal electrical characteristics for silicon carbide, as predicted by theoretical analysis, by making the gate insulating region 26 the limiting factor in obtaining high blocking voltage capability, instead of the silicon carbide substrate. Therefore, the preferred advantages of using silicon carbide over silicon for power applications cannot be fully realized by conventional silicon carbide devices. This is particularly true when in order to compensate for parasitic dielectric breakdown, lower doping levels in the drift region and thicker drift regions are used to reduce the electric field strength in the gate insulating region 26 and thereby inhibit the occurrence of dielectric breakdown while maintaining the same breakdown voltage.

The present invention significantly reduces the need to compensate for parasitic dielectric breakdown by lowering the doping level in the drift region and/or increasing the thickness of the drift region. The present invention also reduces the need to use a linear or step graded drift region doping concentration which increases monotonically in a vertical direction away from the base region 18 and/or a T-shaped gate electrode as disclosed in U.S. application Ser. No. 08/577,859 to Baliga, entitled *Vertical Field Effect Transistor Having Improved Breakdown Voltage Capability/ And Low On-State Resistance, And Methods Of Fabricating Same*, filed Dec. 22, 1995, the disclosure of which is hereby incorporated herein by reference. Instead the benefits of the present invention are achieved by using an electrical insulating region 26 formed of a material having an electrical permittivity greater than about ten times the permittivity of free space ($\epsilon_o$). More preferably, the insulating region 26 is formed to have an electrical permittivity greater than about fifteen times the permittivity of free space so that at device breakdown the ionization integral in the silicon carbide drift region 16 is about unity. The determination of the ionization integral is more fully described in Chapter 3 of the aforementioned Baliga textbook. This corresponds to the condition whereby impact ionization in the drift region 16 has attained an infinite rate and avalanche breakdown begins. The occurrence of breakdown in silicon carbide by avalanche multiplication of electron-hole pairs in the drift region 16, instead of parasitic dielectric breakdown in the electrical insulating region 26, means that near ideal breakdown characteristics, as predicted by theoretical analysis, can be achieved and the preferred advantages of using silicon carbide in place of silicon can be more fully realized, as explained below with respect to the on-state resistance and transconductance.

The present invention also facilitates the use of electrical insulators having low critical electric field strengths relative silicon dioxide. In other words, even electrical insulators which are more susceptible to field induced breakdown at a given electric field strength can be used in place of silicon dioxide to achieve near ideal breakdown characteristics in silicon carbide. Such electrical insulators include titanium dioxide, which can be preferably formed to have an electrical permittivity in the range of about 15-100 times the electrical permittivity of free space. Other electrical insulators may include tantalum pentoxide ($Ta_2O_5$), cerium oxide ($CeO_2$), strontium titanate ($SrTiO_3$) and $BaSrTiO_3$.

Therefore, by using insulating regions having the preferred relatively high electrical permittivities, the need to compensate for parasitic dielectric breakdown by lowering the doping level in the drift region and/or increasing the thickness of the drift region can be significantly reduced. In particular, the use of thinner drift regions (e.g., <7.5 µm) with higher doping concentrations (e.g., $>1\times10^{16}$ cm$^{-3}$) can be pursued to improve transconductance and specific on-resistance to near ideal values without lowering the breakdown voltage to below ideal values.

This is important because transconductance ($g_m$) and specific on-resistance $R_{sp}$ are important measures of the performance of the transistor 10 during on-state conduction. These parameters can be determined by the following relationships:

$$g_m = \mu_{inv} \frac{\epsilon_o \epsilon_i}{t_i} \frac{W}{L_{CH}} V_{ds}$$

$$R_{CH} = \left[ \mu_{inv} \frac{\epsilon_o \epsilon_i}{t_i} \frac{W}{L_{CH}} (V_{gs} - V_{th}) \right]^{-1}$$

where $\mu_{inv}$ is the inversion layer mobility in silicon carbide, W is the width of the gate electrode 28, as measured in a third dimension (not shown), $L_{ch}$ is the length of the inversion layer channel 30, $V_{gs}$ is the bias applied to the gate electrode 28, $V_{th}$ is the threshold voltage and $V_{ds}$ is the applied drain bias. As will be understood by those skilled in the art, the specific on-resistance $R_{sp}$ is approximately equal to the sum of the channel resistance $R_{ch}$ and drift region resistance $R_D$, where $R_D$ is inversely proportional to the doping concentration in the drift region $N_D$ and the thickness of the drift region. Thus, shorter inversion layer channel lengths, higher drift region doping concentrations and thinner drift regions contribute to lower specific on-state resistance and higher transconductance. This is particularly significant for silicon carbide because reported inversion layer channel mobilities (e.g., 15 cm$^2$/Vsec) are considered low relative to silicon and therefore lead to a large contribution of the channel 30 to the total on-state resistance. The use of gate electrode insulating regions having high electrical permittivities also contribute to higher charge densities in the inversion layer channel for a given gate electrode bias and allow for higher doping concentrations in the base region because of an increased gate capacitance. The use of higher doping concentrations in the base region (e.g., $1 \times 10^{18}$ cm$^{-3}$) to preserve the turn-on threshold voltage also allows for thinner base regions (i.e., lower $L_{CH}$) and therefore lower total on-state resistance without the occurrence of base reach-through which can degrade device performance. In particular, base regions having thicknesses less than 1 µm and more preferably less than about 0.6 µm can be used.

To more fully illustrate the advantages of using gate electrode insulating regions comprising electrical insulators having relatively high electrical permittivities, two dimensional numerical simulations of the performance of the above described field effect transistor 10, as illustrated by FIG. 2, were performed. In particular, the simulations were performed on a 6H—SiC substrate with the anisotropy in the mobility accounted for as described in an article by W. J. Schaffer et al. entitled *Conductivity, Anisotropy in Epitaxial 6H and 4H SiC,* Mat. Res. Soc. Symp. Proc., Vol. 339, pp. 595–600 (1994). The drain region 14 was highly doped to a concentration of $2\times10^{18}$ cm$^{-3}$ and the thickness of the gate electrode insulating region was 300 Å. The trench widths ("W$_t$") and spacing between adjacent trenches ("W$_m$") were also selected to be 2 µm and the depth of the trench was selected so that the bottom of the trench was 0.5 µm below the base/drift region junction. Each of the simulations was also performed with respective electrical permittivities for the gate electrode insulating region, including 3.9 (e.g., SiO$_2$), 10 and 15 times the electrical permittivity of free space. The threshold voltage for the three simulations was preselected at 2.2 Volts by varying the base region doping concentration and the critical electric field strength (E$_{crit}$) for the gate electrode insulating region was assumed to be equal to a worst case critical electric field strength of silicon dioxide (e.g., $6\times10^6$ V/cm). However, as will be understood by those skilled in the art, the critical electric field strength of such electrical insulators as titanium dioxide (TiO$_2$) is actually lower than silicon dioxide and in the range of between about $1$–$2\times10^6$ V/cm. The maximum voltage at which the simulated transistors would fail was also designed to be 500 Volts. The base and drift region doping concentrations and thicknesses necessary to obtain the desired maximum blocking voltage are shown in Table 1 along with the calculated inversion layer mobilities at gate biases of 5, 10 and 15 Volts.

µ=1365 cm$^2$/Vsec, the ideal R$_{sp}$ for a silicon device is 33.6 mΩcm$^2$. For 6H—SiC, the drift region doping concentration corresponding to a BV$_{pp}$=500 Volts is N$_D$=5×10$^{16}$ cm$^{-3}$. The corresponding E$_c$ is 3×10$^6$ V/cm. Using a value of µ=80 cm$^2$/Vsec in the "c" direction, the ideal R$_{sp}$ for a silicon carbide device is 0.54 mΩcm$^2$ which is sixty two (62) times lower than that for silicon.

Numerical simulations of the above structure using TMA MEDICI™ also confirm the reduction in on-state resistance and the forward voltage drop (V$_f$) using gate electrode insulating regions having high electrical permittivities, as shown in Table 2. In particular, the simulated specific on-state resistance obtained for the above structure with a gate electrode insulating region having a relative electrical permittivity of 15 is R$_{sp}$=2.9 mΩcm$^2$. This is an order of magnitude lower than the ideal value for silicon and an order of magnitude lower than the value obtained for the above structure having an insulating region with a relative electrical permittivity of 3.9 corresponding to SiO$_2$.

TABLE 1

|  | $\epsilon_i = 3.9$ | $\epsilon_i = 10$ | $\epsilon_i = 15$ |
|---|---|---|---|
| Drift region doping | $5 \times 10^{15}$ cm$^{-3}$ | $2.2 \times 10^{16}$ cm$^{-3}$ | $4.1 \times 10^{16}$ cm$^{-3}$ |
| Drift region thickness | 10.9 µm | 5.7 µm | 4.5 µm |
| Base region doping | $1 \times 10^{17}$ cm$^{-3}$ | $6 \times 10^{17}$ cm$^{-3}$ | $1.3 \times 10^{18}$ cm$^{-3}$ |
| Base region thickness | 1 µm | 0.5 µm | 0.35 µm |
| Inversion layer mobility (V$_G$ = 5 V) | 17.47 cm$^2$/Vs | 12.1 cm$^2$/Vs | 8.19 cm$^2$/Vs |
| Inversion layer mobility (V$_G$ = 10 V) | 18.76 cm$^2$/Vs | 6.76 cm$^2$/Vs | 3.26 cm$^2$/Vs |
| Inversion layer mobility (V$_G$ = 15 V) | 16.13 cm$^2$/Vs | 3.56 cm$^2$/Vs | 1.57 cm$^2$/Vs |

The expression for the ideal specific on-resistance as a function of breakdown voltage is given by:

$$R_{sp} = \frac{4BV_{pp}^2}{\epsilon_s \mu E_c^3}$$

TABLE 2

|  | $\epsilon_i = 3.9$ | $\epsilon_i = 10$ | $\epsilon_i = 15$ |
|---|---|---|---|
| V$_f$ at 100 A/cm$^2$ (V$_G$ = 5 V) | 3.33 V | 0.49 V | 0.29 V |
| V$_f$ at 100 A/cm$^2$ (V$_G$ = 10 V) | 2.44 V | 0.42 V | 0.29 V |
| V$_f$ at 100 A/cm$^2$ (V$_G$ = 15 V) | 2.35 V | 0.45 V | 0.34 V |
| R$_{sp}$ at 100 A/cm$^2$ (V$_G$ = 5 V) | 30 mΩ.cm$^2$ | 4.9 mΩ.cm$^2$ | 2.9 mΩ.cm$^2$ |
| R$_{sp}$ at 100 A/cm$^2$ (V$_G$ = 10 V) | 24 mΩ.cm$^2$ | 4.2 mΩ.cm$^2$ | 2.9 mΩ.cm$^2$ |
| R$_{sp}$ at 100 A/cm$^2$ (V$_G$ = 15 V) | 23.5 mΩ.cm$^2$ | 4.5 mΩ.cm$^2$ | 3.4 mΩ.cm$^2$ |
| Maximum electric field in insulator (E$_{CRIT}$) | $6 \times 10^6$ V/cm | $6 \times 10^6$ V/cm | $6 \times 10^6$ V/cm |
| Maximum electric field in SiC | $1.8 \times 10^6$ V/cm | $3.7 \times 10^6$ V/cm | $5.1 \times 10^6$ V/cm |
| Ionization integral for electrons | $3.92 \times 10^{-5}$ | $1.96 \times 10^{-2}$ | 0.64 |
| Ionization integral for holes | $4.86 \times 10^{-3}$ | 0.64 | 0.99 | where E$_c$ is the critical electric field strength in the drift region for a given drift region doping concentration, µ is the drift region mobility, $\epsilon_s$ is the electrical permittivity of the drift region and B$_{pp}$ is the ideal parallel plane breakdown voltage. For silicon, the drift region doping concentration corresponding to a BV$_{pp}$=500 Volts is N$_D$=5×10$^{14}$ cm$^{-3}$. The corresponding E$_c$ is 2.76×10$^5$ V/cm. Using a value of The computed ionization integrals for the three simulated structures at 500 Volts are also shown in Table 2. In particular, the ionization integral corresponding to $\epsilon_i$=15 is approximately equal to unity which indicates that the blocking performance of the structure is due to breakdown in the silicon carbide substrate and not breakdown in the gate electrode insulating region. In contrast, the ionization integral corresponding to $\epsilon_i=3.9$ is much lower than unity. This indicates that the blocking performance of the conventional structure is inferior to that predicted by theoretical analysis, thus preventing the performance advantages of silicon carbide over silicon from being fully realized. Even larger improvements can be expected when 4H—SiC substrates are used because the mobility for 4H—SiC along the "c" axis is about ten times greater than that for 6H—SiC. Based on the above simulations, a preferred relationship between the drift region doping concentration ($N_D$) and the minimum dielectric constant of the gate electrode insulating region was also determined. In particular, to achieve an ionization integral of about unity at device breakdown, the dielectric constant ($\epsilon_i$) of the gate electrode insulating region and the drift region doping concentration ($N_D$) should be related by the following expression where $\epsilon_{SiC}$ (e.g., 9.7) is the dielectric constant of silicon carbide:

$$\epsilon_i \geq 9.75 \times 10^{-3} N_D^{0.131} \epsilon_{SiC}$$

Accordingly, the use of electrical insulators having high electrical permittivities relative to conventional electrical insulators for semiconductor devices such as silicon dioxide, have been shown to significantly improve the breakdown voltage and on-state resistance characteristics of a silicon carbide switching device to the point of near ideal characteristics, as predicted by theoretical analysis. Thus, the preferred advantages of using silicon carbide, instead of silicon, can be more fully realized. This is also true for electrical insulators such as $TiO_2$ which have low critical electric field strengths relative to conventional electrical insulators such as silicon dioxide. These preferred advantages of using electrical insulators having high electrical permittivities may also be applicable to other wide bandgap materials (e.g., $E_{gap} > 1.5$ eV) besides silicon carbide, including diamond, III-V nitrides and phosphides such as cubic BN, GaN, $GaAs_{1-x}P_x$ (x=0.1→1) and $Al_xGa_{1-x}N_yP_{1-y}$ and II-VI selenides, tellurides, oxides and sulfides such as $Zn_xCd_{1-x}S_ySe_{1-y}$, CdSe, CdS, ZnS, CdTe and ZnO.

Figure 3:
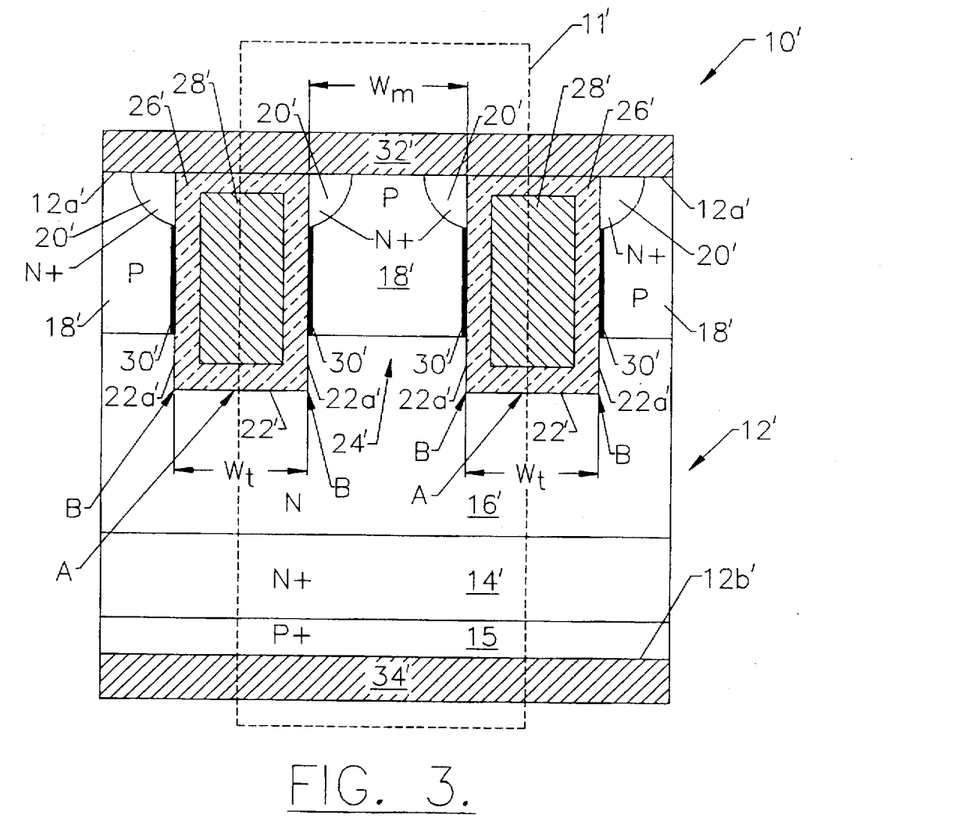
FIG. 3 illustrates a silicon carbide switching device according to another embodiment of the present invention.

Referring now to FIG. 3, a cross-sectional illustration of a silicon carbide switching device according to another embodiment of the present invention is shown. This embodiment is an insulated gate bipolar transistor 10' and is similar to the embodiment of FIG. 2, however, an anode region 15 of second conductivity type is provided adjacent the second face 12b' and the base region 18' extends to the first face 12a' and forms a continuous ohmic contact to a cathode electrode 32' at the first face 12a'. Although not shown, the N+ buffer region 14' is electrically shorted to the anode electrode 34' in a third dimension. As will be understood by those skilled in the art, the anode and base regions form the emitter and collector regions of a vertical bipolar transistor. The operation of insulated gate bipolar transistors, like the transistor of FIG. 3, is more fully described in the aforementioned Baliga textbook and in U.S. Pat. Nos. 5,396,087 and 5,412,228 to Baliga.

Figure 4A:
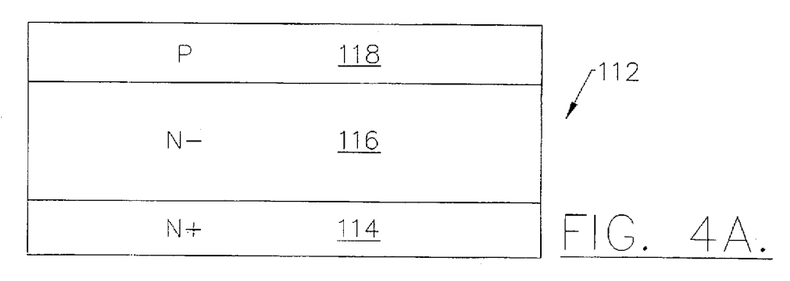
FIGS. 4A–4M are schematic cross-sectional views of intermediate structures illustrating a method of forming a silicon carbide switching device according to the embodiment of FIG. 2.
Figure 4B:
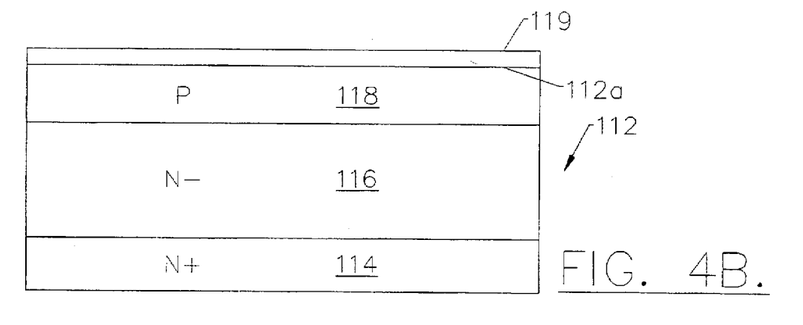
Figure 4C:
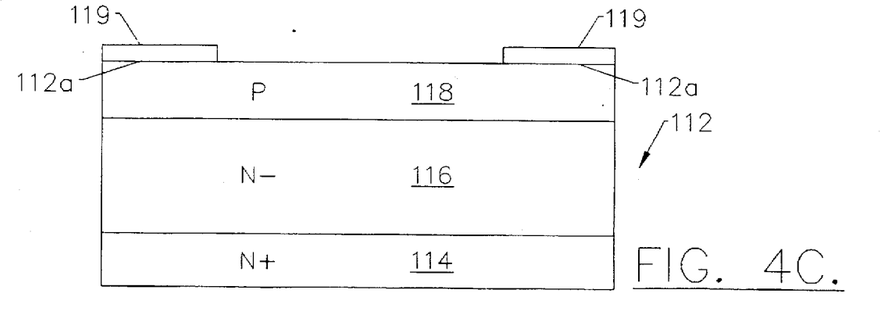
Figure 4D:
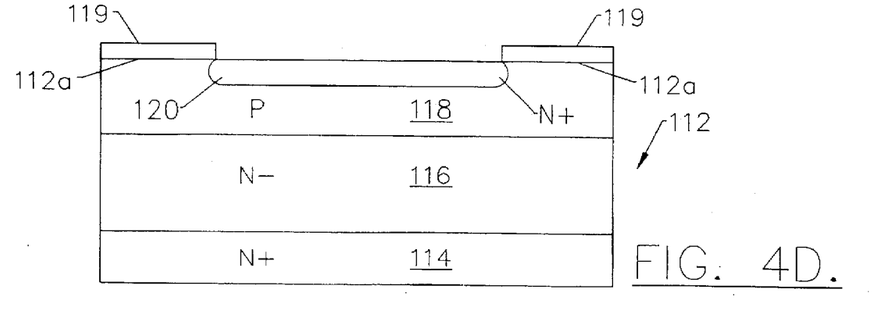

Referring now to FIGS. 4A–4M, a method of forming a silicon carbide switching device according to the embodiment of FIG. 2 will now be described. The method includes the steps of providing a silicon carbide substrate 112 as illustrated by FIG. 4A. Monocrystalline silicon carbide substrates 112 of the type illustrated by FIG. 4A may include a relatively highly doped substrate layer of first conductivity type (shown as N+) which acts as a drain region 114; a relatively lightly doped epitaxially grown silicon carbide layer of first conductivity type (shown as N-) which acts as a drift region 116; and a second conductivity type epitaxially grown silicon carbide layer (shown as P-type) which acts as a base region 118. Referring now to FIGS. 4B–4C, an implant masking layer 119 (e.g., LTO) is then applied to a first face 112a of the substrate 112 and patterned to expose a portion of the first face 112a. Next, a highly doped source region 120 of first conductivity type is formed in the base region 118 by performing a high dose implant of first conductivity type dopants into the exposed face, using the patterned masking layer 119 as a source implant mask, as illustrated by FIG. 4D. Preferably, the implanted source dopant is then annealed to activate the source dopant.

Figure 4E:
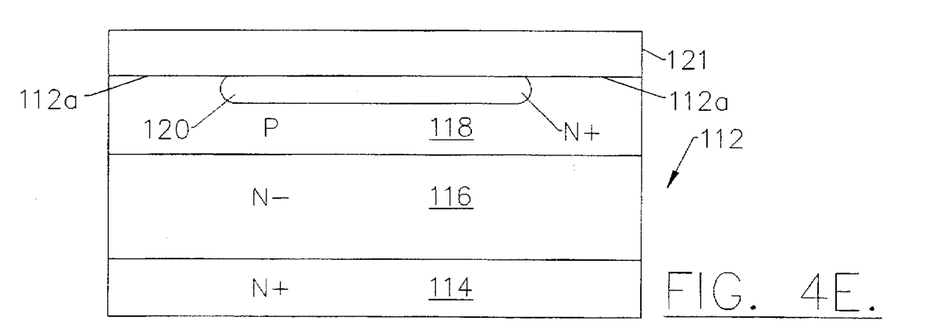
Figure 4F:
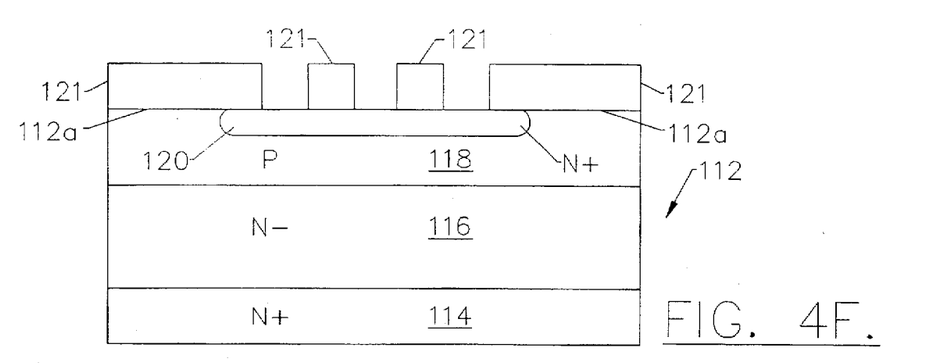
Figure 4G:
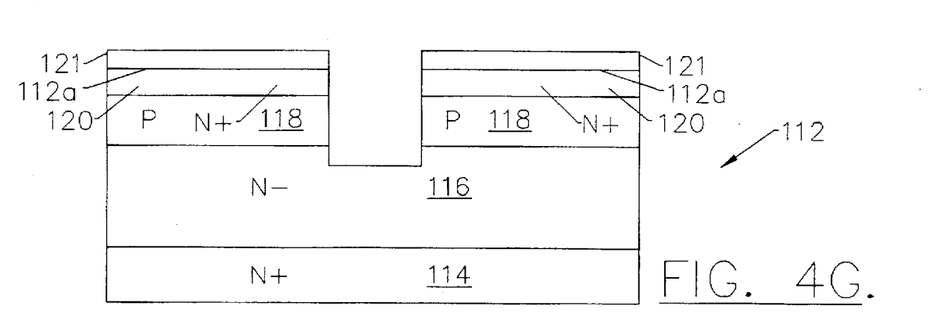
Figure 4H:
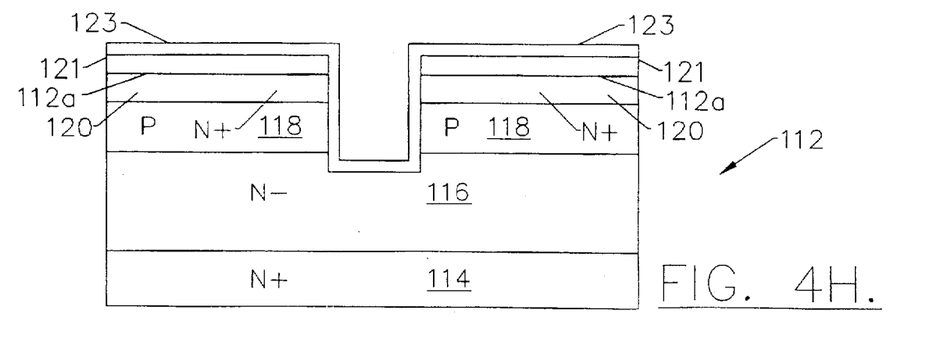
Figure 4I:
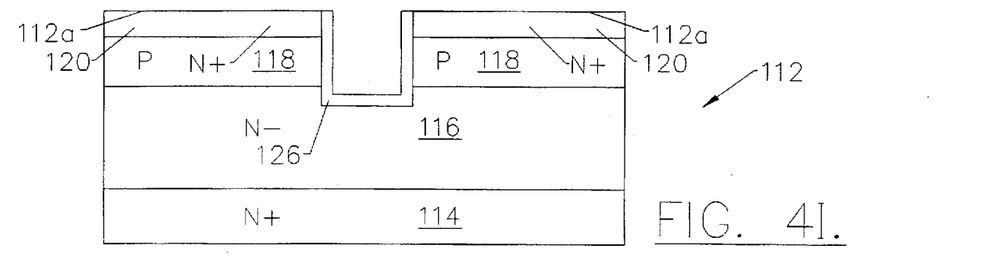
Figure 4J:
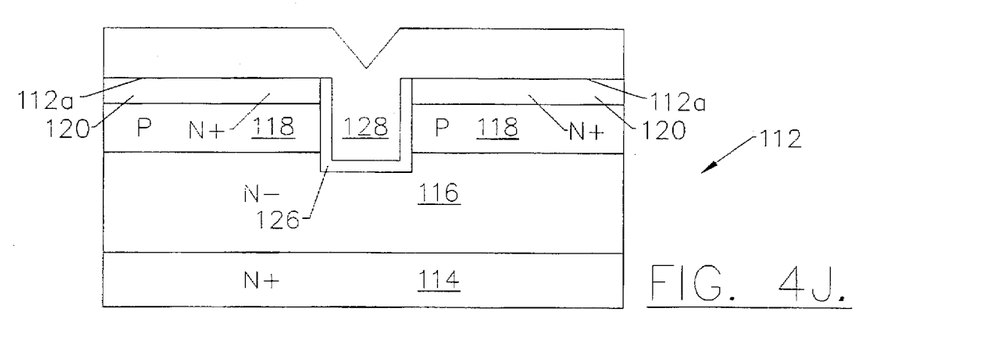
Figure 4K:
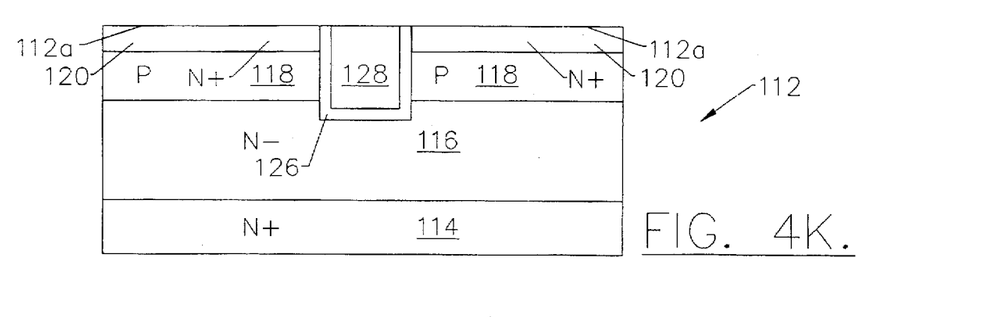
Figure 4L:
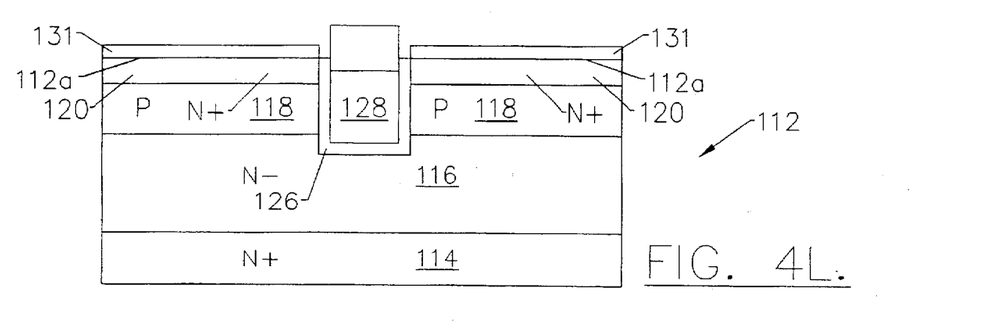
Figure 4M:
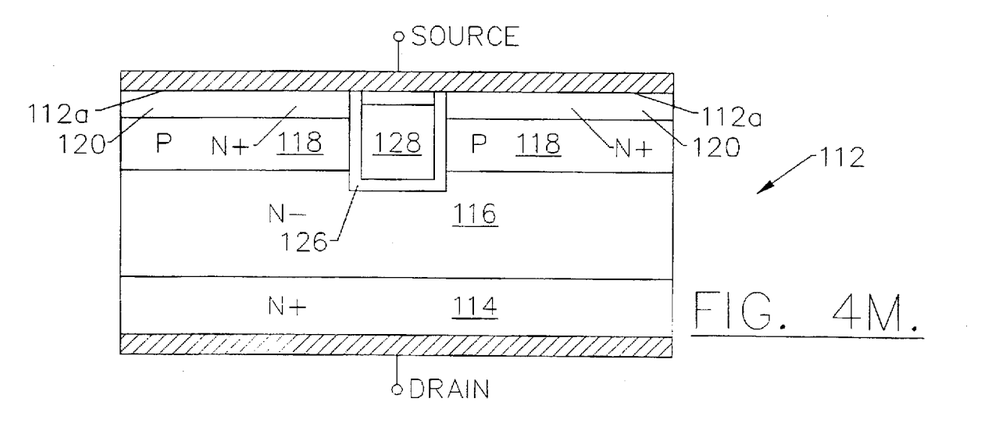

The patterned implant masking layer 119 is then stripped from the first face 112a and followed by the step of spinning a photoresist layer 121 on the first face 112a, as illustrated by FIG. 4E. The photoresist layer 121 is then patterned over the source region 120 using conventional techniques, to expose a plurality of surface locations at the first face 112a, as illustrated by FIG. 4F. Referring now specifically to one of the exposed locations, the photoresist layer 121 is then used as a mask while the source region 120 and P-base region 118 are etched to form a trench, preferably using the above described reactive ion etching (RIE) technique or similar technique, as illustrated by FIG. 4G. Thereafter, a layer 123 of titanium metal (Ti) having a thickness of about 500 Å, is preferably evaporated onto the sidewalls and bottom of the trench, as illustrated by FIG. 4H. Lift-off of the evaporated titanium on the face 112a is then accomplished by removing the patterned photoresist layer 121. As illustrated by FIG. 4I, the evaporated titanium remaining on the trench bottoms and sidewalls is then oxidized to form a $TiO_2$ gate electrode insulating region 126 at relatively low temperature which prevents any appreciable oxidation of the surrounding silicon carbide regions. The oxidation growth conditions are also preferably selected to achieve the desired dielectric constant for the $TiO_2$ insulating region 126. Alternative methods of forming $TiO_2$ insulating regions are also disclosed in an article by T. Fuyuki entitled "*Effects of Small Amount of Water on Physical and Electrical Properties of $TiO_2$ Films Deposited by CVD Method*", The Journal of the Electrochemical Society, Vol. 135, No. 1, pp. 248–250 (1988). Referring now to FIGS. 4J–4L, an insulated gate electrode is then formed on the titanium dioxide in the trench by preferably depositing a degenerately doped polycrystalline silicon layer 128 into the trench, planarizing the face 112a and then oxidizing the top surface of the polycrystalline silicon in the trench. During this latter step, a thin layer 131 of oxidized silicon carbide will also form on the face 112a, however this thin layer can be removed with a dilute HF etch. Referring finally to FIG. 4M, source and drain metallization is then applied to the first face 112a and second face 112b of the substrate 112, respectively. Contacts to the gate electrode and base and source regions are also made in a third dimension, not shown.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A silicon carbide switching device, comprising:

a silicon carbide substrate having first and second opposing faces;

a silicon carbide drift region of first conductivity type in said silicon carbide substrate;

a silicon carbide base region of second conductivity type in said silicon carbide substrate, said silicon carbide base region forming a P-N rectifying junction with said silicon carbide drift region;

a silicon carbide source region of first conductivity type in said silicon carbide substrate, said silicon carbide source region forming a P-N rectifying junction with said silicon carbide base region;

a trench in said silicon carbide substrate, said trench having a bottom extending adjacent said silicon carbide drift region and a sidewall extending from said silicon carbide drift region, adjacent said silicon carbide base region and to the first face;

a gate electrode in said trench for modulating the conductivity of said silicon carbide base region upon application of a gate bias thereto;

a first electrode on the first face and ohmically contacting said silicon carbide source region;

a second electrode on the second face and ohmically contacting said silicon carbide substrate; and a gate electrode insulating region disposed in said trench, between said gate electrode and said silicon carbide drift and base regions, said gate electrode insulating region comprising a material selected from the group consisting of electrical insulators having electrical permittivities greater than about ten times the permittivity of free space.

2. The silicon carbide switching device of claim 1, wherein said gate electrode insulating region comprises a material having a critical electric field strength which is less than a critical electric field strength of silicon dioxide.

3. The silicon carbide switching device of claim 1, wherein said gate electrode insulating region comprises titanium dioxide.

4. The silicon carbide switching device of claim 2, wherein said gate electrode insulating region comprises titanium dioxide.

5. The silicon carbide switching device of claim 2, wherein said silicon carbide substrate comprises 4H—SiC.

6. The silicon carbide switching device of claim 2, wherein said drift region has a first conductivity type doping concentration greater than $2 \times 10^{16}$ cm$^{-3}$.

7. The silicon carbide switching device of claim 6, wherein said base region has a second conductivity type doping concentration greater than $5 \times 10^{17}$ cm$^{-3}$.

8. The silicon carbide switching device of claim 14, wherein said base region comprises a layer having a thickness of less than about 0.6 μm.

9. A silicon carbide switching device, comprising:

a silicon carbide substrate;

a silicon carbide drift region of first conductivity type in said silicon carbide substrate;

a silicon carbide base region of second conductivity type in said silicon carbide substrate, said silicon carbide base region forming a P-N rectifying junction with said silicon carbide drift region;

a silicon carbide source region of first conductivity type in said silicon carbide substrate, said silicon carbide source region forming a P-N rectifying junction with said silicon carbide base region;

gate electrode means, disposed adjacent said silicon carbide base region, for modulating the conductivity of said silicon carbide base region upon the application of a gate bias thereto;

a first electrode on said silicon carbide substrate;

a second electrode on said silicon carbide substrate; and a gate electrode insulating region disposed between said gate electrode means and said silicon carbide base region, said gate electrode insulating region comprising a material selected from the group consisting of electrical insulators having electrical permittivities greater than about ten times the permittivity of free space ($\epsilon_o$).

10. The silicon carbide switching device of claim 9, wherein said gate electrode insulating region comprises a material having a critical electric field strength which is less than a critical electric field strength of silicon dioxide.

11. The silicon carbide switching device of claim 9, wherein said gate electrode insulating region comprises titanium dioxide.

12. The silicon carbide switching device of claim 10, wherein said gate electrode insulating region comprises titanium dioxide.

13. The silicon carbide switching device of claim 9, further comprising a trench having a sidewall extending adjacent said silicon carbide base region.

14. A silicon carbide switching device, comprising:

a silicon carbide substrate having first and second opposing faces;

a silicon carbide drift region of first conductivity type in said silicon carbide substrate;

a silicon carbide base region in said silicon carbide substrate, between said silicon carbide drift region and the first face;

a trench in said silicon carbide substrate, said trench having a bottom extending adjacent said silicon carbide drift region and a sidewall extending from said silicon carbide drift region, adjacent said silicon carbide base region and to the first face;

a gate electrode in said trench for modulating the conductivity of said silicon carbide base region upon the application of a gate bias thereto;

a first electrode on the first face and ohmically contacting said silicon carbide substrate;

second electrode on the second face and ohmically contacting said silicon carbide substrate; and a gate electrode insulating region disposed in said trench, between said gate electrode and said silicon carbide drift and base regions, said gate electrode insulating region comprising a material selected from the group consisting of electrical insulators having dielectric constants greater than the dielectric constant of silicon dioxide.

15. The silicon carbide switching device of claim 14, wherein said gate electrode insulating region comprises a material having a critical electric field strength which is less than a critical electric field strength of silicon dioxide.

16. The silicon carbide switching device of claim 14, wherein said drift region has a first conductivity type doping concentration greater than $2 \times 10^{16}$ cm$^{-3}$.

17. The silicon carbide switching device of claim 16, wherein said base region is of second conductivity type and has a second conductivity type doping concentration greater than $5 \times 10^{17}$ cm$^{-3}$.

18. The silicon carbide switching device of claim 17, further comprising a silicon carbide source region of first conductivity type disposed between said silicon carbide base region and the first face and wherein said base region comprises a layer having a thickness of less than about 0.6 μm.

19. A silicon carbide switching device, comprising:

a silicon carbide substrate having first and second opposing faces;

a silicon carbide drift region of first conductivity type in said silicon carbide substrate;

a silicon carbide base region of second conductivity type in said silicon carbide substrate, said silicon carbide base region forming a P-N rectifying junction with said silicon carbide drift region;

a silicon carbide source region of first conductivity type in said silicon carbide substrate, said silicon carbide source region forming a P-N rectifying junction with said silicon carbide base region;

a trench in said silicon carbide substrate, said trench having a bottom extending adjacent said silicon carbide drift region and a sidewall extending from said silicon carbide drift region, adjacent said silicon carbide base region and to the first face;

a gate electrode in said trench for modulating the conductivity of said silicon carbide base region upon the application of a gate bias thereto;

a first electrode on the first face and ohmically contacting said silicon carbide source region;

a second electrode on the second face and ohmically contacting said silicon carbide substrate; and a gate electrode insulating region comprising titanium dioxide, said gate electrode insulating region extending between said gate electrode and said silicon carbide drift and base regions.

20. The silicon carbide switching device of claim 19, wherein said gate electrode insulating region has an effective permittivity in a range between about fifteen and eighty times a permittivity of free space.

21. The silicon carbide switching device of claim 19, wherein a critical electrical field strength of said gate electrode insulating region is less than a critical electrical field strength of silicon dioxide.

22. The silicon carbide switching device of claim 20, wherein a critical electrical field strength of said gate electrode insulating region is less than a critical electrical field strength of silicon dioxide.

23. A silicon carbide field effect transistor, comprising:

a silicon carbide substrate having first and second opposing faces;

a silicon carbide drift region of first conductivity type in said silicon carbide substrate;

a silicon carbide base region of first conductivity type in said silicon carbide substrate;

a silicon carbide source region of first conductivity type in said silicon carbide substrate, said silicon carbide source region having a doping concentration greater than a doping concentration of said silicon carbide base region;

a trench in said silicon carbide substrate, said trench having a bottom extending adjacent said silicon carbide drift region and a sidewall extending from said silicon carbide drift region, adjacent said silicon carbide base region and to the first face;

a gate electrode in said trench for modulating the conductivity of said silicon carbide base region upon the application of a gate bias thereto;

a first electrode on the first face and ohmically contacting said silicon carbide source region;

a second electrode on the second face and ohmically contacting said silicon carbide substrate; and a gate electrode insulating region disposed in said trench, between said gate electrode and said silicon carbide drift and base regions, said gate electrode insulating region comprising a material selected from the group consisting of electrical insulators having electrical permittivities greater than about ten times the permittivity of free space.

24. The silicon carbide switching device of claim 23, wherein said gate electrode insulating region comprises a material having a critical electric field strength which is less than a critical electric field strength of silicon dioxide.

25. The silicon carbide switching device of claim 23, wherein said gate electrode insulating region comprises titanium dioxide.

26. The silicon carbide switching device of claim 24, wherein said gate electrode insulating region comprises titanium dioxide.

27. The silicon carbide switching device of claim 24, wherein said silicon carbide substrate comprises 4H—SiC.

28. A silicon carbide power semiconductor device, comprising:

a silicon carbide substrate; and an insulated gate power semiconductor device in said silicon carbide substrate, said insulated gate power semiconductor device including a gate electrode, a silicon carbide drift region of first conductivity type, a silicon carbide base region of second conductivity type adjacent said drift region and a gate electrode insulating region disposed between said gate electrode and said base and drift regions, said gate electrode insulating region selected from the group consisting of electrical insulators having electrical permittivities greater than about ten times the permittivity of free space.

29. The silicon carbide power semiconductor device of claim 28, wherein said gate electrode insulating region comprises a material having a critical electric field strength which is less than a critical electric field strength of silicon dioxide.

30. A silicon carbide power semiconductor device, comprising:

a silicon carbide substrate; and an insulated gate power semiconductor device in said silicon carbide substrate, said insulated gate power semiconductor device including a silicon carbide drift region with a first conductivity type doping concentration therein and a gate electrode insulating region selected from the group consisting of electrical insulators having dielectric constants greater than about $9.75 \times 10^{-3} N_{dr}^{0.131} \epsilon_{SiC}$, where $\epsilon_{SiC}$ and $N_D$ are the dielectric constant and first conductivity type doping concentration of the silicon carbide drift region, respectively, and where $N_D$ is greater than about $2 \times 10^{16}$ cm$^{-3}$.

31. The silicon carbide power semiconductor device of claim 30, wherein said gate electrode insulating region comprises a material having a critical electric field strength which is less than a critical electric field strength of silicon dioxide.

32. The silicon carbide power semiconductor device of claim 30, wherein said insulated gate power semiconductor device includes a trench in said silicon carbide drift region, extending to a face of said silicon carbide substrate, wherein said gate electrode insulating region extends in said trench and adjacent a bottom thereof and wherein $N_D$ is greater than about $4 \times 10^{16}$ cm$^{-3}$ adjacent the bottom of said trench.

33. A power semiconductor device, comprising:

a wide bandgap semiconductor substrate; and an insulated gate power semiconductor device in said wide bandgap semiconductor substrate, said insulated gate power semiconductor device including a gate electrode, a wide bandgap semiconductor drift region of first conductivity type, a wide bandgap semiconductor base region of second conductivity type adjacent said drift region and a gate electrode insulating region disposed between said gate electrode and said base and drift regions, said gate electrode insulating region selected from the group consisting of electrical insulators having electrical permittivities greater than about ten times the permittivity of free space.

34. The power semiconductor device of claim 33, wherein said gate electrode insulating region comprises a material having a critical electric field strength which is less than a critical electric field strength of silicon dioxide.

* * * * *

UNITED STATES PATENT AND TRADEMARK OFFICE
CERTIFICATE OF CORRECTION

PATENT NO. : 5,742,076
DATED : April 21, 1998
INVENTOR(S) : Srikant Sridevan; Peter Kerr McLarty; Bantval Jayant Baliga It is certified that error appears in the above-identified patent and that said Letters Patent is hereby corrected as shown below:

On the title page,

<u>Other Publications</u>
Alok et al.        Delete "*Devicces*" and substitute -- *Devices* -- therefor.
Masao Taguchi      Delete "No. 13" and substitute -- No. 12 -- therefor.
Tye et al.         Delete "*Characterisitics*" and substitute -- *Characteristics* -- therefor.
Allen et al.       Delete "50" and substitute -- 50% -- therefor, and do not begin a new line with "P.A.E."

Column 13, Line 43    Delete "claim 14" and substitute -- claim 7 -- therefor.

Column 14, Line 36    insert --a-- before "second electrode"

Signed and Sealed this

Eleventh Day of May, 1999

Attest:

Q. TODD DICKINSON

*Attesting Officer*        *Acting Commissioner of Patents and Trademarks*